(12) United States Patent
Pauchard et al.

(10) Patent No.: US 7,741,657 B2
(45) Date of Patent: Jun. 22, 2010

(54) INVERTED PLANAR AVALANCHE PHOTODIODE

(75) Inventors: Alexandre Pauchard, Châtel-St-Denis (CH); Michael T. Morse, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 365 days.

(21) Appl. No.: 11/488,311

(22) Filed: Jul. 17, 2006

(65) Prior Publication Data

US 2008/0012104 A1 Jan. 17, 2008

(51) Int. Cl.
  *H01L 31/0328* (2006.01)
  *H01L 31/0336* (2006.01)
  *H01L 31/072* (2006.01)
  *H01L 31/109* (2006.01)

(52) U.S. Cl. ............... 257/186; 257/E31.063; 257/185; 257/438

(58) Field of Classification Search .......... 257/E31.038, 257/E31.063, 676, 438, 184–186, 436, 605, 257/606
See application file for complete search history.

(56) References Cited

U.S. PATENT DOCUMENTS

| | | | |
|---|---|---|---|
| 3,324,297 A | | 6/1967 | Stieltjes et al. |
| 4,009,058 A | | 2/1977 | Mills |
| 4,212,019 A | | 7/1980 | Wataze et al. |
| 4,786,573 A | * | 11/1988 | Amada et al. ............ 430/65 |
| 5,157,473 A | * | 10/1992 | Okazaki .................. 257/438 |
| 5,233,209 A | | 8/1993 | Rodgers et al. |
| 5,280,189 A | | 1/1994 | Schuppert et al. |
| 5,401,952 A | * | 3/1995 | Sugawa ................. 250/208.1 |
| 5,420,634 A | * | 5/1995 | Matsumoto ............. 348/311 |
| 5,596,186 A | | 1/1997 | Kobayashi |
| 5,654,578 A | * | 8/1997 | Watanabe ................ 257/438 |

(Continued)

FOREIGN PATENT DOCUMENTS

CN 1327272 12/2001

(Continued)

OTHER PUBLICATIONS

PCT/US2007/072879, International Search Report and Written Opinion, mailed Nov. 29, 2007.

(Continued)

*Primary Examiner*—Chris C Chu
(74) *Attorney, Agent, or Firm*—Blakely, Sokoloff, Taylor & Zafman LLP

(57) ABSTRACT

An avalanche photodetector is disclosed. An apparatus according to aspects of the present invention includes a semiconductor substrate layer including a first type of semiconductor material. The apparatus also includes a multiplication layer including the first type of semiconductor material disposed proximate to the semiconductor substrate layer. The apparatus also includes an absorption layer having a second type of semiconductor material disposed proximate to the multiplication layer such that the multiplication layer is disposed between the absorption layer and the semiconductor substrate layer. The absorption layer is optically coupled to receive and absorb an optical beam. The apparatus also includes an n+ doped region of the first type of semiconductor material defined at a surface of the multiplication layer opposite the absorption layer. A high electric field is generated in the multiplication layer to multiply charge carriers photogenerated in response to the absorption of the optical beam received in the absorption layer.

12 Claims, 1 Drawing Sheet

U.S. PATENT DOCUMENTS

| | | | |
|---|---|---|---|
| 5,757,057 A * | 5/1998 | Dabrowski | 257/438 |
| 5,897,371 A | 4/1999 | Yeh et al. | |
| 6,074,892 A | 6/2000 | Bowers et al. | |
| 6,104,047 A * | 8/2000 | Watanabe | 257/186 |
| 6,130,441 A | 10/2000 | Bowers et al. | |
| 6,384,462 B1 * | 5/2002 | Pauchard et al. | 257/461 |
| 6,459,107 B2 | 10/2002 | Sugiyama et al. | |
| 6,465,803 B1 | 10/2002 | Bowers et al. | |
| 6,492,239 B2 | 12/2002 | Yang et al. | |
| 6,515,315 B1 | 2/2003 | Itzler et al. | |
| 6,632,028 B1 | 10/2003 | Yang et al. | |
| 6,635,908 B2 | 10/2003 | Tanaka et al. | |
| 6,693,308 B2 | 2/2004 | Sankin et al. | |
| 6,759,675 B2 | 7/2004 | Csutak et al. | |
| 6,797,581 B2 | 9/2004 | Vickers | |
| 6,831,265 B2 | 12/2004 | Yoneda et al. | |
| 6,858,463 B2 | 2/2005 | Bond | |
| 6,858,912 B2 * | 2/2005 | Marshall et al. | 257/438 |
| 6,963,089 B2 | 11/2005 | Shi et al. | |
| 7,072,557 B2 | 7/2006 | Nagarajan et al. | |
| 7,082,248 B1 | 7/2006 | Morse | |
| 7,122,734 B2 | 10/2006 | Fetzer et al. | |
| 7,160,753 B2 | 1/2007 | Williams, Jr. | |
| 7,271,405 B2 | 9/2007 | Krishna et al. | |
| 7,348,608 B2 | 3/2008 | Ko et al. | |
| 2005/0006678 A1 | 1/2005 | Tanaka et al. | |

FOREIGN PATENT DOCUMENTS

| | | |
|---|---|---|
| EP | 0 709 901 A1 | 5/1996 |
| GB | 2 025 693 A | 1/1980 |
| GB | 2 054 957 A | 2/1981 |
| JP | 61-226976 A | 10/1986 |
| JP | 04-093088 | 3/1992 |
| KR | 100206079 B1 | 7/1999 |
| WO | WO 2004/027879 A2 | 4/2004 |

OTHER PUBLICATIONS

Temkin, H. et al., "$Ge_{0.6}Si_{0.4}$ rib waveguide avalanche photodetectors for 1.3 μm operation", Appl. Phys. Lett. 49 (13), Sep. 29, 1986, pp. 1311-1313.

Liu, Y. et al., "Simple, very low dark current, planar long-wavelength avalanche photodiode", Appl. Phys. Lett. 53 (14), Oct. 3, 1988, pp. 809-811.

Liu, Y. et al., "A Planar InP/InGaAs Avalanche Photodiode with Floating Guard Ring and Double Diffused Junction", Journal of Lightwave Technology, 10 (2), Feb. 1992, pp. 182-193.

Hawking, A.R. et al., "High gain-bandwidth-product silicon heterointerface photodetector", Appl. Phys. Lett. 70 (3), Jan 20, 1997, pp. 303-305.

Herbert, D.C., "Theory of SiGe Waveguide Avalanche Detectors Operating at λ=1.3 μm", IEEE Transactions on Electron Devices, 45 (4), Apr. 1998, pp. 791-796.

Cho, S.R. et al., "Suppression of avalanche gain at the junction periphery by floating guard rings in a planar InGaAs/InGaAsP/InP avalanche photodiodes", CLEO 2000, May 9, 2000, pp. 212-213.

Kang, Y. et al., "Fused InGaAs-Si Avalanche Photodiodes With Low-Noise Performances", IEEE Photonics Technology Letters, 14 (11), Nov. 2002, pp. 1593-1595.

Shi, Jin-Wei et al., "Design and Analysis of Separate-Absorption-Transport-Charge-Multiplication Traveling-Wave Avalanche Photodetectors", Journal of Lightvvave Technology, 22 (6), Jun. 2004, pp. 1583-1590.

Herbert, D.C. et al., "Impact ionisation and noise in SiGe multiquantum well structures," Electronics Letters, vol. 32, No. 17, Aug. 15, 1996, pp. 1616-1618.

Nie, H. et al., "Resonant-Cavity Separate Absorption, Charge and Multiplication Avalanche Photodiodes With High-Speed and High Gain-Bandwidth Product," IEEE Photonics Technology Letters, vol. 10, No. 3, Mar. 1998, pp. 409-411.

Lenox, C. et al., "Resonant-Cavity InGaAs-InAlAs Avalanche Photodiodes with Gain-Bandwidth Product of 290 GHz," IEEE Photonics Technology Letters, vol. 11, No. 9, Sep. 1999, pp. 1162-1164.

Pauchard, A. et al., "High-performance InGaAs-on-silicon avalanche photodiodes," Wednesday Afternoon, OFC 2002, pp. 345-346.

Loudon, A. et al., "Enhancement of the infrared detection efficiency of silicon photon-counting avalanche photodiodes by use of silicon germanium absorbing layers," Optics Letters, vol. 27, No. 4, Feb. 15, 2002, pp. 219-221.

Das, N.R. et al., "On the frequency response of a resonant-cavity-enhanced separate absorption, grading, charge, and multiplication avalanche photodiode," Journal of Applied Physics, vol. 92, No. 12, Dec. 15, 2002, pp. 7133-7145.

Emsley, M. et al., "High-Speed Resonant-Cavity-Enhanced Silicon Photodetectors on Reflecting Silicon-On-Insulator Substrates," IEEE Photonics Technology Letters, vol. 14, No. 4, Apr. 2002, pp. 519-521.

Dosunmu, O. et al., "High-Speed Resonant Cavity Enhanced Ge Photodetectors on Reflecting Si Substrates for 1550-nm Operations," IEEE Photonics Technology Letters, vol. 17, No. 1, Jan. 2005, pp. 175-177.

Hawkins, A. et al., "High gain-bandwidth-product silicon heterointerface photodetector," Appl. Phys. Letter 70 (3), Jan. 20, 1997, pp. 303-305.

Lee, D. et al., "Ion-Implanted Planar-Mesa IMPATT Diodes for Millimeter Wavelengths," IEEE Transactions on Electron Devices, vol. Ed-25, No. 6, Jun. 1978, pp. 714-722.

Liu, Y. et al., "Simple, very low dark current, planar long-wavelength avalanche photodiode," Appl. Phys. Letter 53 (14), Oct. 3, 1988, pp. 1311-1313.

Mikawa, T. et al., "Germanium Reachthrough Avalanche Photodiodes for Optical Communication Systems at 1.55-μm Wavelength Region," IEEE Transactions on Electron Devices, vol. Ed-31, No. 7, Jul. 1984, pp. 971-977.

Mikami, O. et al., "Improved Germanium Avalanche Photodiodes," IEEE Journal of Quantum Electronics, vol. QE-16, No. 9, Sep. 1980, pp. 1002-1007.

Yoshimoto, T. et al., "SOI Waveguide GeSi Avalanche Pin Photodetector at 1.3 μm Wavelength," IEICE Trans. Electron, vol. E81-C, No. 10, Oct. 1998, pp. 1667-1669.

Sugiyama, M. et al., "A 1.3-μm Operation Si-Based Planar P-I-N Photodiode with Ge Absorption Layer Using Strain-Relaxing Selective Epitaxial Growth Technology," Extended Abstracts of the International Conference on Solid State Devices and Materials, Japan Society of Applied Physics, Sep. 1998, pp. 384-385.

Kesan, V.P. et al., "Integrated Waveguide-Photodetector Using Si/SiGe Multiple Quantum Wells for Long Wavelength Applications," Conference Article, Dec. 9, 1990, pp. 637-640.

Ru, Y. et al., "The properties of Epitaxial Pure Germanium Films on Silicon Substrate," IEEE, 2001, pp. 634-636.

Li, N. et al., "InGaAs/InAlAs avalanche photodiode with undepleted absorber," Applied Physics Letters, vol. 82, No. 13, Mar. 31, 2003, pp. 2175-2177.

Zheng, L. et al., "Demonstration of High-Speed Staggered Lineup GaAsSb-InP Unitraveling Carrier Photodiodes," IEEE Photonics Technology Letters, vol. 17, No. 3, Mar. 2005, pp. 651-653.

Office Action mailed Oct. 6, 2006, U.S. Appl. No. 11/170,556, filed Jun. 28, 2005.

Office Action mailed Dec. 12, 2008, U.S. Appl. No. 11/724,805, filed Mar. 15, 2007.

Office Action mailed Mar. 13, 2008, U.S. Appl. No. 11/490,994, filed Jul. 20, 2006.

Office Action mailed Sep. 15, 2008, U.S. Appl. No. 11/490,994, filed Jul. 20, 2006.

Office Action mailed Mar. 30, 2009, U.S. Appl. No. 11/490,994, filed Jul. 20, 2006.

Office Action mailed Oct. 13, 2005, U.S. Appl. No. 11/121,511, filed May 3, 2005.

Office Action mailed Feb. 1, 2006, U.S. Appl. No. 11/121,511, filed May 3, 2005.

Office Action mailed Apr. 14, 2006, U.S. Appl. No. 11/121,511, filed May 3, 2005.

Office Action mailed Jul. 6, 2006, U.S. Appl. No. 11/121,511, filed May 3, 2005.

Office Action mailed Nov. 23, 2005, U.S. Appl. No. 11/243,325, filed Oct. 4, 2005.

Office Action mailed May 30, 2008, U.S. Appl. No. 11/322,514, filed Dec. 30, 2005.

Office Action mailed Dec. 24, 2008, U.S. Appl. No. 11/322,514, filed Dec. 30, 2005.

First Chinese Office Action, Chinese application No. 200610151347.1, filed Jun. 28, 2006.

Second Chinese Office Action, Chinese application No. 200610151347.1, filed Jun. 28, 2006.

Green, M.A., et al., "Progress and outlook for high-efficiency crystalline silicon solar cells", Solar Energy Materials & Solar Cells, 2001, vol. 65, pp. 9-16.

First Chinese Office Action dated Mar. 28, 2008, Chinese Application No. 200610077681.7, filed Apr. 28, 2006.

Second Chinese Office Action, Chinese Application No. 200610077681.7, filed Apr. 28, 2006.

European Office Action dated May 2, 2008, European Application No. 06758860.8, filed Apr. 28, 2006.

Third Chinese Office Action dated Apr. 3, 2009, Chinese Application No. 200610151347.1, filed Jun. 28, 2006.

Fourth Chinese Office Action dated Jul. 17, 2009, Chinese Application No. 200610151347.1, filed Jun. 28, 2006.

Korean Preliminary Rejection, Korean Patent Application No. 10-2007-7030930, filed Jun. 28, 2006.

Office Action mailed Jun. 23, 2009, U.S. Appl. No. 11/724,805, filed Mar. 15, 2007.

Office Action mailed Sep. 16, 2009, U.S. Appl. No. 11/490,994, filed Jul. 20, 2006.

\* cited by examiner

US 7,741,657 B2

INVERTED PLANAR AVALANCHE PHOTODIODE

BACKGROUND OF THE INVENTION

1. Field of the Invention

Embodiments of invention relate generally to optical devices and, more specifically but not exclusively relate to photodetectors.

2. Background Information

The need for fast and efficient optical-based technologies is increasing as Internet data traffic growth rate is overtaking voice traffic pushing the need for fiber optical communications. Transmission of multiple optical channels over the same fiber in the dense wavelength-division multiplexing (DWDM) system provides a simple way to use the unprecedented capacity (signal bandwidth) offered by fiber optics. Commonly used optical components in the system include wavelength division multiplexed (WDM) transmitters and receivers, optical filter such as diffraction gratings, thin-film filters, fiber Bragg gratings, arrayed-waveguide gratings, optical add/drop multiplexers, lasers, optical switches and photodetectors. Photodiodes may be used as photodetectors to detect light by converting incident light into an electrical signal. An electrical circuit may be coupled to the photodetector to receive the electrical signal representing the incident light. The electrical circuit may then process the electrical signal in accordance with the desired application. Avalanche photodetectors provide internal electrical gain and therefore have high sensitivity suitable for very weak optical signal detection.

BRIEF DESCRIPTION OF THE DRAWINGS

Non-limiting and non-exhaustive embodiments of the present invention are described with reference to the following FIGURES, wherein like reference numerals refer to like parts throughout the various views unless otherwise specified.

DETAILED DESCRIPTION

Figure 1:
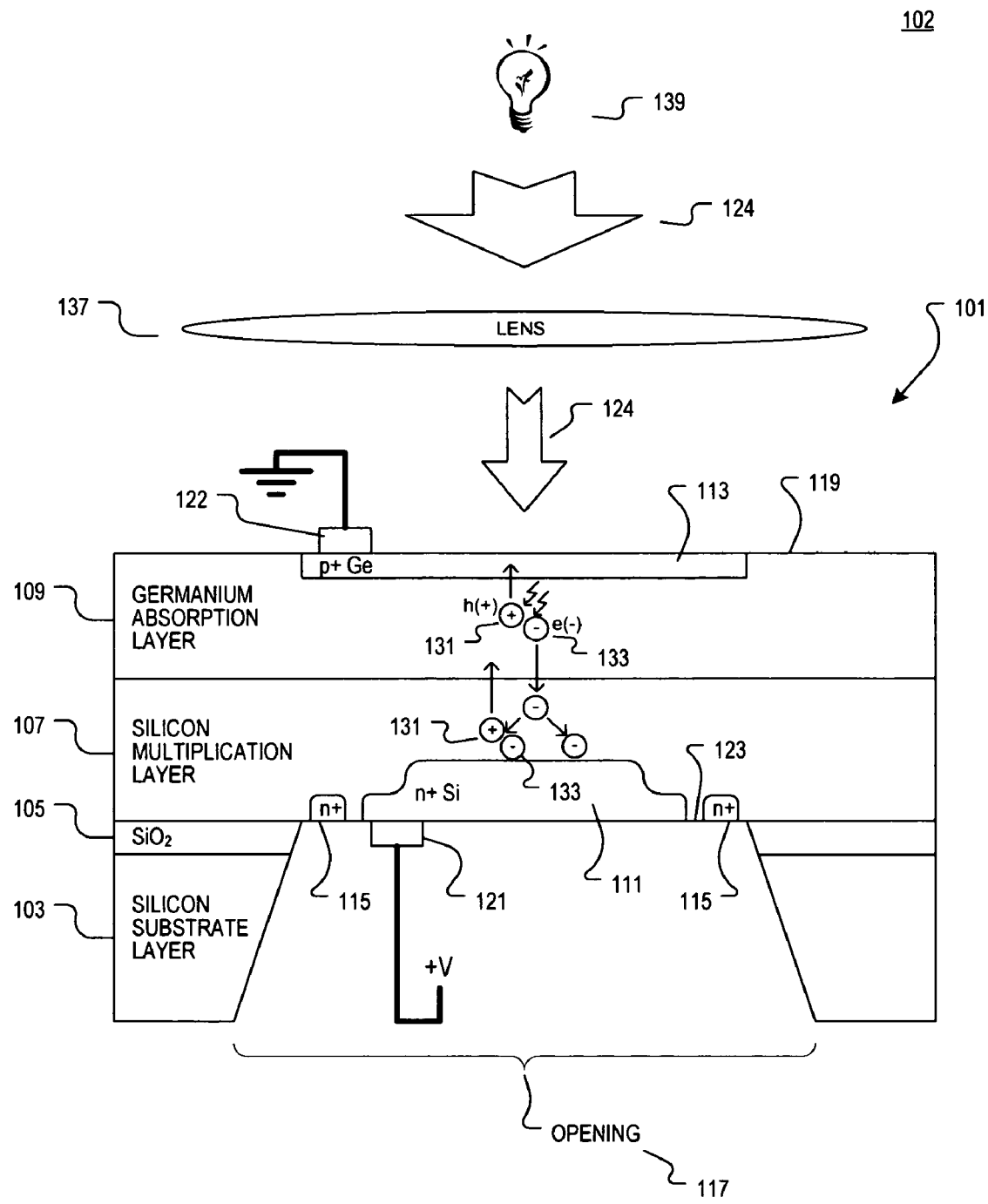
FIG. 1 is a diagram illustrating an example of a cross-section view of an inverted planar avalanche photodetector with a multiplication layer between an absorption layer and a semiconductor substrate layer in a system in accordance with the teachings of the present invention.

Methods and apparatuses for inverted planar avalanche photodetectors (APDs) are disclosed. In the following description numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments. In addition, it is appreciated that the FIGURES provided herewith are for explanation purposes to persons ordinarily skilled in the art and that the drawings are not necessarily drawn to scale. Moreover, it is appreciated that the specific example doping concentrations, thicknesses and materials or the like that are described in this disclosure are provided for explanation purposes and that other doping concentrations, thicknesses and materials or the like may also be utilized in accordance with the teachings of the present invention.

FIG. 1 is a diagram illustrating generally a cross-section view of a system 102 including an inverted planar avalanche photodetector (APD) 101 according to an example of the present invention. In the illustrated example, light or an optical beam 124 is directed from an optical source 139 to APD 101. Depending on the specific application, optical beam 124 may originate from or may be reflected from optical source 139. In one example, optical beam 124 may optionally be directed or focused from optical source 139 directly to APD 101 or may be directed through an optical element 137 to APD 101.

In the example depicted in FIG. 1, it is noted that the light or optical beam 124 is illustrated to be directed to APD 101 from the "top" for explanation purposes. In another example, however, it is appreciated that the light or optical beam 124 may be directed to APD 101 from the "top" or "bottom" in accordance with the teachings of the present invention.

It is appreciated that one or more APDs 101 may be used in a variety of applications and configurations. For instance, depending on the specific application, it is appreciated that APD 101 may be employed individually to for example detect a signal encoded in lower power optical beam 124 in telecommunications. In another example, APD 101 may be one of a plurality of APDs arranged in an array or grid to sense images or the like. For example, an array APD's arranged in a grid may function to sense images, similar to a complementary metal oxide semiconductor (CMOS) sensor array or the like.

In one example, optical element 137 may include a lens or other type of refractive or diffractive optical element such that an image is directed or focused on array of APDs 101 with illumination including optical beam 124. Optical beam 124 may include visible light, infrared light and/or a combination of wavelengths across the visible through infrared spectrum or the like. For instance, in one example APD 101 is sensitive to optical beam 124 having wavelengths in the range of approximately 1.0 µm to 1.6 µm.

In the illustrated example, APD 101 is functionally a combination of a photodiode that converts optical signal into electrical signal and an amplifier that multiplies the detected signal with gain. As shown, APD 101 includes a semiconductor substrate layer 103, a multiplication layer 107 disposed proximate to the semiconductor substrate layer and an absorption layer 109 disposed proximate to the multiplication layer 107 such that the multiplication layer 107 is disposed between the semiconductor substrate layer 103 and the absorption layer 109. In the illustrated example, the semiconductor substrate 103 and the multiplication layer 107 both include a first type of semiconductor material, such as silicon, while the absorption layer 109 includes a second type of semiconductor material, such as germanium or a germanium-silicon alloy material.

In the example, an external bias voltage V+ may be applied to the APD 101 between contacts 121 and 122. In various examples, typical voltage values for the external bias voltage V+ may be greater than or equal to 20 volts. In other examples, it is appreciated that other voltage values may be used for the external bias voltage V+ in accordance with the teachings of the present invention. As shown in the example, contact 121 is coupled to the multiplication layer 107 through an n+ doped first type semiconductor region 111 and a contact 122 coupled absorption layer 109 through a p+ doped second type semiconductor region 113. The n+ doped region 111 and the p+ doped region 113 which help improve the ohmic contact of contacts 121 and 122 to the APD 101 in accordance with the teachings of the present invention.

As shown in the example illustrated in FIG. 1, n+ doped region 111 is defined on a surface 123 or side of the multiplication layer 107 that is opposite from the absorption layer 109. In other words, n+ doped region 111 is defined on the surface 123 that is on the same side of multiplication layer 107 as the semiconductor substrate layer 103. In order to access n+ doped region 111 at surface 123 of multiplication layer 107, n+ doped region 111 is defined inside an opening 117 defined in semiconductor substrate 103 in accordance with the teachings of the present invention.

In the example shown in FIG. 1, APD 101 functionally includes two regions in terms of electric field strength—one is in absorption region 109, in which a low electric field is created with the application of the external bias voltage V+ to APD 101. In one example, the low electric field present in the absorption layer 109 is approximately 100 kV/cm. The other electric field region is in the multiplication layer 107, in which a high electric field is created by the doping concentrations included in the regions of APD 101 in accordance with the teaching of the present invention. In one example, the high electric field present in the multiplication layer 107 is approximately 500 kV/cm.

In operation, optical beam 124 is directed through a top surface 119 of absorption layer 109 and into absorption layer 109. Free charge carriers or electron-hole pairs are initially photo-generated in the absorption layer 109 by the incident photons of optical beam 124 if the photon energy is equal to or higher than the band gap energy of the semiconductor material (e.g. germanium/germanium-silicon alloy) inside low electric field absorption layer 109. These photo-generated charge carriers are illustrated in FIG. 1 as holes 131 and electrons 133.

With the application of the external bias voltage V+ to APD 101 resulting in the low electric field in absorption layer 109, the holes 131 are accelerated towards contact 122 coupled to absorption layer 109 while the electrons 133 are accelerated towards contact 121 out from the absorption layer 109 into the multiplication layer 107 in accordance with the teachings of the present invention.

Electrons 133 are separated from holes 131 as they injected as a result of the low electric field in the absorption layer 109 into the high electric field in multiplication layer 107. Impact ionization occurs as electrons 133 gain enough kinetic energy and collide with other electrons in the semiconductor material in multiplication layer resulting in additional electron-hole pairs, shown as holes 131 and electrons 133 being produced in multiplication layer 109, resulting in at least a fraction of the electron-hole pairs becoming part of a photocurrent. A chain of such impact ionizations leads to carrier multiplication in accordance with the teachings of the present invention. Avalanche multiplication continues to occur until the electrons 133 move out of the active area of the APD 101 to contact 121.

In the example illustrated in FIG. 1, it is appreciated that the absorption layer 109 is not etched and is therefore fully planar. In contrast, part of the semiconductor substrate layer 103 illustrated in the example is removed during fabrication of APD 101 in order to access surface 123 of the multiplication layer 107. By so doing, the n+ doped region 111 may be implanted on surface 123 of the multiplication layer 107. In one example, n+ doped region 111 serves to define laterally the multiplication layer 107. In one example, a metallic layer including contact 121 may then be coupled to n+ doped region through opening 117.

FIG. 1 also illustrates that a guard ring structure 115 may also be included in APD 101, which in the illustrated example is shown as a floating guard ring having an n+ doped semiconductor material disposed on surface 123 of multiplication layer surrounding n+ doped region 111. In another example, it is appreciated that guard ring structure 115 may not necessarily be floating as illustrated in FIG. 1, but instead may be coupled to a known potential. In the various examples, the guard ring structure 115 helps to avoid or reduce premature edge breakdown in the multiplication layer 107 in accordance with the teachings of the present invention.

In one example, fabrication of APD 101 may begin with a low-doped silicon layer. In one example, this low-doped silicon layer may be for example a silicon substrate. In another example, this low-doped silicon layer may be an epitaxially grown silicon layer over or on top of silicon or a silicon-on-insulator (SOI) wafer. In the example shown in FIG. 1, this low-doped silicon layer is shown as multiplication layer 107. The example shown in FIG. 1 shows a buried oxide layer of an SOI wafer, which is illustrated as $SiO_2$ layer 105. The silicon substrate layer of the SOI wafer is illustrated as silicon substrate layer 103 in FIG. 1. In an example in which an SOI wafer is not used, then the $SiO_2$ layer 105 is not included in accordance with the teachings of the present invention. In one example, the doping concentration of the multiplication layer 107 is relatively low, such as for example 1E15 cm-3. In one example, the thickness of the multiplication layer 107 is in the range of approximately 0.2 μm to 1 μm. Indeed, if the multiplication layer 107 is too thin the gain will be too low and if it is too thick, the device bandwidth of APD 101 would be too low.

Continuing with the example, an absorption layer 109 that includes germanium material is then epitaxially grown over the multiplication layer 107. In one example, a thickness of the 1 μm is chosen for the germanium absorption layer 109. However, in other examples, the thickness of the germanium absorption layer 109 may be increased to increase the responsivity or may be reduced to increase the detector speed. In one example, the doping concentration of the germanium absorption layer 109 is also relatively low, such as for example 1E15 cm-3.

In the example, a top p+ doped region 113 is then formed in or on the top surface 119 of the germanium absorption layer 109 using for example ion implantation, a diffusion process or another suitable technique. In one example, p+ doped region 113 has a relatively high doping concentration, such as for example greater than 5E19 cm-3, to provide a good ohmic contact for contact 122. It is noted that in the example shown in FIG. 1, the p+ doped region is localized on the top surface 119, but in another example, the p+ doped region 113 could also be a layer grown epitaxially on absorption layer 109, in which case the p+ doped region 113 would not be localized laterally on the top surface 119 of absorption layer 109.

Continuing with the illustrated example, the silicon substrate layer 103 may then be thinned using standard lapping technologies down to a thickness of for example about 80 μm or less. In one example, the final thickness of the silicon substrate layer 103 should be small to facilitate the subsequent processing steps, but the final thickness of the silicon substrate layer 103 should also be thick enough to remain robust. Indeed, if the wafer is too thin it will become too brittle and break.

As shown in FIG. 1, the region below the device active area is then etched away using for example wet or dry etching to form opening 117 to expose or provide access to the surface 123 of the multiplication layer 107 through the silicon substrate layer 103 and the SiO$_2$ oxide layer 105, if applicable, in accordance with the teachings of the present invention. In the example, the opening 117 should be large enough to allow the subsequent processing steps to take place. In an example in which an SOI wafer is not used and SiO$_2$ layer 105 is therefore not included, then the silicon substrate layer 103 is the layer of silicon that is etched to define opening 117 to expose or provide access to the surface 123 of the multiplication layer 107 in accordance with the teachings of the present invention.

Continuing with the example, n+ doped region 111 is then defined on the surface 123 of the multiplication layer 107 using ion implantation or diffusion or another suitable technique through opening 117. In the example, the n+ doped region 111 is used to help provide an electrical connection to the silicon epitaxial multiplication layer 107. Once the n+ doped region 111 is formed, contact 121 may be coupled to n+ doped region using metallization layer or other suitable technique through the opening 117. In one example, to avoid premature edge breakdown in the multiplication layer, a guard ring structure 115 may also be defined in surface 123 through opening 117 as shown. In various examples, several techniques can be used to avoid edge breakdown, such as the floating guard ring structure 115 shown in FIG. 1. In another example, another contact may be coupled to guard ring structure 115 to tie the guard ring structure 115 to a known potential in accordance with the teachings of the present invention. In one example, a double implant or diffusion or other suitable technique may be used to form guard ring structure 115 through opening 117 as shown.

It is appreciated that APD 101 is not a fully planar device since the silicon substrate layer 103 is etched to create opening 117 as discussed above. However, it is noted that the region of silicon substrate layer 103 that is etched to define opening 117 is not critical for the device performance APD 101, so the negative impact on performance of APD 101 as a result of the etching is reduced. In addition, APD 101 doesn't require the deposition of a passivation layer on exposed etched surfaces such as surface 123.

With the opening 117 provided by the etching as discussed above, full access to surface 123 of multiplication layer 107 is provided, which enables precise control when implanting or diffusing the n+ doped region 111 and the guard ring structure 115. Indeed, with the full access provided by opening 117, it is therefore possible to accurately define this region of APD 101 on surface 123 of multiplication layer 107 to prevent edge breakdown and to tailor the vertical electric field profile of APD 101 in accordance with the teachings of the present invention.

The above description of illustrated embodiments of the invention, including what is described in the Abstract, is not intended to be exhaustive or to be limitation to the precise forms disclosed. While specific embodiments of, and examples for, the invention are described herein for illustrative purposes, various equivalent refinements and modifications are possible, as those skilled in the relevant art will recognize. Indeed, it is appreciated that any specific wavelengths, dimensions, materials, times, voltages, power range values, etc., are provided for explanation purposes and that other values may also be employed in other embodiments in accordance with the teachings of the present invention.

These modifications can be made to embodiments of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation.

What is claimed is:

1. An apparatus, comprising:
   a semiconductor substrate layer including a first type of semiconductor material;
   a multiplication layer including the first type of semiconductor material disposed proximate to the semiconductor substrate layer;
   an absorption layer including a second type of semiconductor material disposed proximate to the multiplication layer such that the multiplication layer is disposed between the absorption layer and the semiconductor substrate layer, wherein the absorption layer is optically coupled to receive and absorb an optical beam;
   an n+ doped region of the first type of semiconductor material defined at a surface of the multiplication layer opposite the absorption layer, wherein a high electric field is generated in the multiplication layer to multiply charge carriers photo-generated in response to the absorption of the optical beam received in the absorption layer;
   first metallic contact coupled to the n+ doped region at the surface of the multiplication layer opposite the absorption layer to apply a bias voltage to the n+ doped region; and
   a p+ doped region in the absorption layer, wherein the p+ doped region extends only partially into the absorption layer.

2. The apparatus of claim 1 wherein the n+ doped region is defined inside an opening defined through the semiconductor substrate layer to access the multiplication layer.

3. The apparatus of claim 1 wherein the multiplication layer includes silicon.

4. The apparatus of claim 3 wherein the absorption layer includes a germanium layer epitaxially grown over the multiplication layer.

5. The apparatus of claim 1 further comprising a guard ring structure defined around the n+ doped region at the surface of the multiplication layer opposite the absorption layer.

6. The apparatus of claim 5 wherein the guard ring structure is a floating guard ring including n+ doped type of semiconductor material.

7. The apparatus of claim 5 wherein the guard ring structure is coupled to a known potential.

8. The apparatus of claim 1 further comprising a second contact coupled to the absorption layer, wherein the bias voltage is applied between the first metallic contact and the second contact to create a low electric field across the absorption layer.

9. The apparatus of claim 8 the second is coupled to the p doped region in the absorption layer.

10. The apparatus of claim 1 further comprising an oxide layer of a silicon-on-insulator wafer disposed between the semiconductor substrate layer and the multiplication layer.

11. The apparatus of claim 1 wherein the first type of semiconductor includes silicon and the second type of semiconductor material includes germanium or a germanium-silicon alloy.

12. An apparatus, comprising:
    a semiconductor substrate layer including a first type of semiconductor material;
    a multiplication layer including the first type of semiconductor material disposed proximate to the semiconductor substrate layer;

an absorption layer including a second type of semiconductor material disposed proximate to the multiplication layer such that the multiplication layer is disposed between the absorption layer and the semiconductor substrate layer, wherein the absorption layer is optically coupled to receive and absorb an optical beam;

an n+ doped region of the first type of semiconductor material defined at a surface of the multiplication layer opposite the absorption layer, wherein a high electric field is generated in the multiplication layer to multiply charge carriers photo-generated in response to the absorption of the optical beam received in the absorption layer; and a p+ doped region in the absorption layer, wherein the p+ doped region extends only partially into the absorption layer.

* * * * *

UNITED STATES PATENT AND TRADEMARK OFFICE
CERTIFICATE OF CORRECTION

PATENT NO. : 7,741,657 B2 Page 1 of 1
APPLICATION NO. : 11/488311
DATED : June 22, 2010
INVENTOR(S) : Pauchard et al.

It is certified that error appears in the above-identified patent and that said Letters Patent is hereby corrected as shown below:

In column 6, at line 53, delete, "p" and insert --p+--.

Signed and Sealed this

Thirtieth Day of November, 2010

David J. Kappos
*Director of the United States Patent and Trademark Office*